United States Patent
Lee

(10) Patent No.: US 7,485,533 B2
(45) Date of Patent: Feb. 3, 2009

(54) FABRICATION METHOD OF AN NON-VOLATILE MEMORY

(75) Inventor: Tzyh-Cheang Lee, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 294 days.

(21) Appl. No.: 11/549,639

(22) Filed: Oct. 14, 2006

(65) Prior Publication Data

US 2007/0072373 A1    Mar. 29, 2007

Related U.S. Application Data

(62) Division of application No. 10/907,708, filed on Apr. 13, 2005.

(51) Int. Cl.
*H01L 21/336* (2006.01)

(52) U.S. Cl. .................. 438/261; 257/E21.21

(58) Field of Classification Search ........... 438/261, 438/288, 591; 257/E21.21
See application file for complete search history.

(56) References Cited

U.S. PATENT DOCUMENTS

| | | | | |
|---|---|---|---|---|
| 5,364,806 A * | 11/1994 | Ma et al. | ........ | 438/266 |
| 6,885,044 B2 * | 4/2005 | Ding | ........ | 257/202 |
| 6,927,131 B2 * | 8/2005 | Kim | ........ | 438/261 |

* cited by examiner

*Primary Examiner*—Chandra Chaudhari
(74) *Attorney, Agent, or Firm*—Jianq Chyun IP Office

(57) ABSTRACT

A non-volatile memory cell is provided. The non-volatile memory includes a substrate, a gate stacked layer, an isolation layer and a conductive layer. The gate stacked layer includes a tunneling layer, a charge trapping layer, a barrier layer and a control gate layer sequentially stacked over the substrate, and the stacked gate layer has an opening therein through these layers. The isolation layer is located on the surface of the opening. The conductive layer is disposed in the opening to cover the isolation layer.

14 Claims, 3 Drawing Sheets

FABRICATION METHOD OF AN NON-VOLATILE MEMORY

CROSS-REFERENCE TO RELATED APPLICATION

This is a divisional application of patent application Ser. No. 10/907,708, filed on Apr., 13, 2005, which is now pending. The entirety of the above-mentioned patent application is hereby incorporated by reference herein and made a part of this specification.

BACKGROUND OF THE INVENTION

1. Field of the Invention

The present invention relates to a fabrication method of a memory. More particularly, the present invention relates to a fabrication method of an non-volatile memory.

2. Description of Related Art

Electrically erasable programmable read-only-memory (EEPROM) is a type of non-volatile memory that allows multiple data writing, reading and erasing operations. Because the stored data will be retained even after power to the device is removed, EEPROM has been broadly applied in personal computer and electronic equipment.

Typically, the floating gate and the control gate of an electrically erasable programmable read-only-memory are fabricated with polysilicon. In programming the memory, the injected charges are evenly distributed in the polysilicon floating gate. However, if the tunneling layer underneath the polysilicon floating gate contains some defects, a leakage current may form leading to a drop in the reliability of the device.

To resolve the above-mentioned problem, an insulating, charge-trapping layer often takes the place of the conventional floating gate in the memory. A material used in forming the charge-trapping layer includes silicon nitride, for example. Since the charge-trapping layer normally includes a silicon oxide layer above and below thereof to form an oxide-nitride-oxide (ONO) stacked structure, this type of memory is often referred as a silicon-oxide-nitride-oxide-silicon (SONOS) memory. In programming a SONOS memory, electrons injected into the silicon nitride layer are not distributed evenly. In other words, most injected electrons are localized in one particular region within the silicon nitride layer. Therefore, not only the leakage current problem is resolved, two bits of data can be stored in a single memory cell to form the so-called 2 bits-per-cell non-volatile memory.

FIG. 1 is a schematic, cross-sectional view diagram of a conventional SONOS memory cell. Referring to FIG. 1, the SONOS memory cell is constructed with a substrate 100, a source region 102, a drain region 104, a lower silicon oxide layer 106, a silicon nitride layer 108, an upper oxide layer 110, and a gate layer 112. The lower silicon oxide layer 106, the silicon nitride layer 108 and the upper oxide layer 110 disposed over the substrate 100 constitute the silicon oxide-silicon nitride-silicon oxide (ONO) stacked layer 114. Further, as shown in FIG. 1, the regions 116 and 118 depict the charge-storing regions. For a SONOS memory cell, charges are injected to the silicon nitride layer near the source region 104 and the drain region 102. In other words, the charge storing regions 116, 118 can each stored with one bit of data, and a 2 bit per cell type of non-volatile memory is provided.

The injected charges are Gaussian distributed in the regions 116 and 118 in the silicon nitride layer 108 (as shown by curves 120 and 122 in FIG. 1). As the integration of device increases and the device dimension gradually decreases, the charge storing regions 116, 118 approaches and even overlaps each other. The bits stored in the regions 116 and 118 will influence each other. As a result, the reliability of the memory is reduced.

SUMMARY OF THE INVENTION

Accordingly, the present invention provides a method for fabricating a non-volatile memory, wherein two bits in a single memory are prevented from affecting each other to maintain the reliability of the memory.

The present invention further provides a non-volatile memory, wherein a multi-bits memory having two bits of data stored in a single memory is provided.

The present invention provides a fabrication method for a non-volatile memory. The method includes forming, sequentially on a substrate, a tunneling layer, a charge trapping layer, a barrier layer and a control gate layer. A first mask layer is formed on the control gate layer, wherein the first mask layer includes a first opening that exposes a region predetermined for forming the memory. Thereafter, a second mask layer is formed on the sidewall of the first opening. Further using the first and the second mask layers as a mask, portions of the control gate layer, the barrier layer, the charge trapping layer and the tunneling layer are removed to form a second opening therein through these film layers. The first and the second mask layers are then removed, followed by forming an insulation layer on the surface of the second opening. The second opening is filled with a conductive, wherein the conductive layer also covers the insulation layer. A third mask layer is then formed over a portion of the control gate layer, the insulation layer and the conductive layer. A stacked gate structure is defined using the third mask layer. The third mask layer is subsequently removed.

In accordance to one embodiment of the fabrication method for a non-volatile memory of the present invention, forming the second mask layer on the sidewall of the first opening includes forming a conformal mask material layer on the top surface of the first mask layer and on the surface of the first opening, followed by performing an anisotropic etching process to remove the mask material layer at the top surface of the first mask layer and at the bottom of the first opening.

In accordance to one embodiment of the fabrication method for a non-volatile memory of the present invention, the dimension of the first opening of the first mask layer and/or the dimension of the third mask layer are critical dimension (CD) of the photolithograph process.

In accordance to one embodiment of the fabrication method for a non-volatile memory of the present invention, wherein the first mask layer and/or the second mask layer is, but not limited to, silicon oxide, silicon nitride or silicon oxynitride.

In accordance to one embodiment of the fabrication method for a non-volatile memory of the present invention, the conductive layer includes, but not limited to, polysilicon.

In accordance to one embodiment of the fabrication method for a non-volatile memory of the present invention, forming the insulation layer on the second surface of the second opening and filling the second opening with the conductive layer include forming a conformal insulation material layer on the top surface of the control gate layer and on the surface of the second opening. A conductive material layer is then formed on the insulation material layer, wherein the conductive material layer at least fills the second opening. The conductive material layer and the insulation material layer outside the second opening are further removed. In another embodiment, a conformal insulation material layer is formed on the top surface of the control gate layer and on the surface of the second opening. The insulation material layer outside the second opening is removed to form the insulation layer. A conductive material layer is then formed on the insulation layer and on the top surface of the control gate layer. The conductive material layer at least fills the second opening. The conductive material layer outside the second opening is subsequently removed.

According to one embodiment of the fabrication method for a non-volatile memory of the present invention, after using the third mask layer to define the gate stacked structure, source/drain regions are further formed in the substrate beside the gate stacked structure.

The present invention provides a non-volatile memory, wherein the non-volatile memory includes, from the substrate, a gate stacked layer, an insulation layer and a conductive layer. The gate stacked layer is disposed on the substrate, and the gate stacked layer includes, but not limited to, a tunneling layer, a charge trapping layer, a barrier layer and a control gate layer, sequentially from the substrate. The gate stacked layer also has an opening therein through the stacked layers. Moreover, the insulation layer is disposed on the surface of the opening, and the conductive layer is disposed in the opening, covering the insulation layer.

According to one embodiment of the fabrication method for a non-volatile memory of the present invention, the charge trapping layer includes, but not limit to, polysilicon or silicon nitride. The tunneling layer is a silicon nitride layer, for example. The barrier layer includes, but not limit to, silicon oxide. The control gate layer or the conductive layer includes polysilicon, for example.

In accordance to one embodiment of the fabrication method for a non-volatile memory of the present invention, a source region and a drain region are further disposed in the substrate beside the stacked gate layer.

By forming an insulation layer in an opening that is formed in the gate stacked layer, the 2-bit regions for storing the two set of charges in the charge trapping layer in a single memory are isolated. Therefore, in programming the memory, the two bits stored in the charge trapping layer are separated. The problems of the two bits in a single memory to interfere with each other are prevented.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2A through 2E are schematic, cross-sectional views showing the steps for fabricating a SONOS memory according to one embodiment of the present invention.

Figure 1:
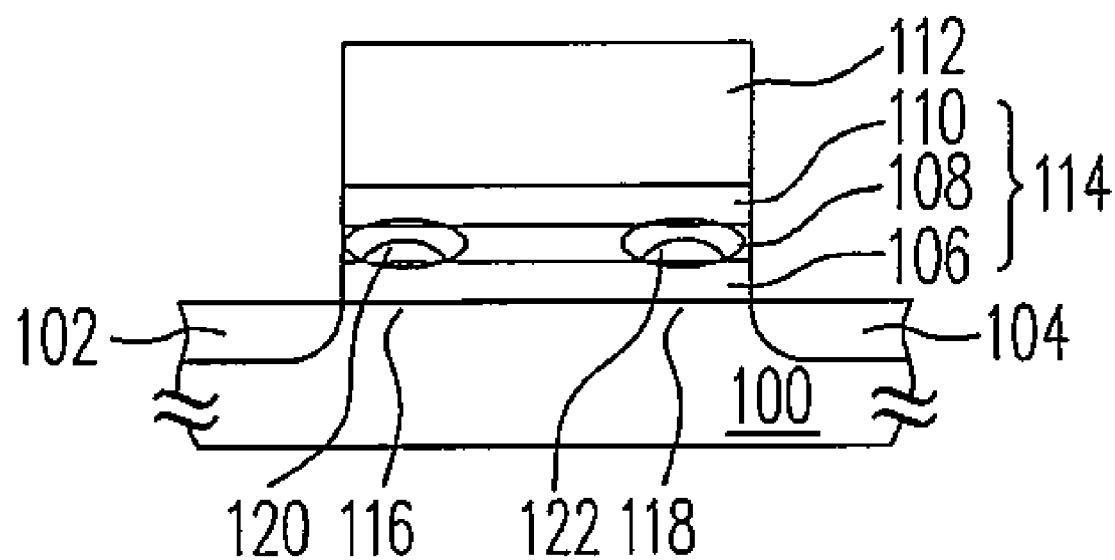
FIG. 1 is a schematic, cross-sectional view diagram illustrating a conventional SONOS memory.
Figure 2A:
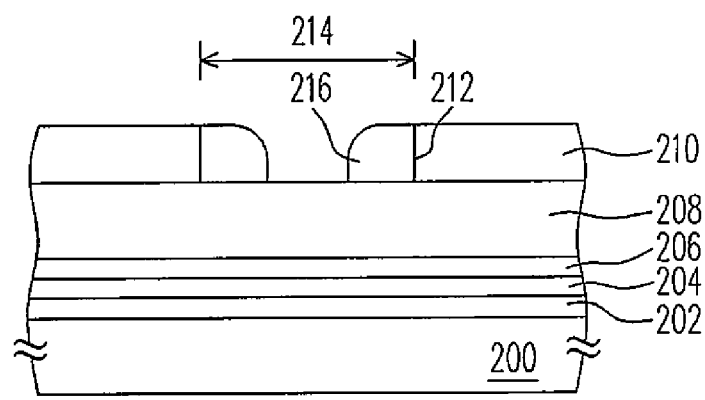
FIGS. 2A through 2E are schematic cross-sectional views showing the steps for fabricating a SONOS memory according to one embodiment of the present invention.

Referring to FIG. 2A, a tunneling layer 202, a charge trapping layer 204, a barrier layer 206 and a control gate layer 208 are formed sequentially on a substrate 200. A material used in forming the tunneling layer 202 includes silicon oxide or other types of applicable materials, for example. The tunneling layer is formed by, for example, thermal oxidation or other appropriate processes. The charge trapping layer 204 is formed with a material that includes polysilicon, silicon nitride or other appropriate materials. The charge trapping layer 204 is formed by chemical vapor deposition or other appropriate processes, for example. The material of the barrier layer 206 includes silicon oxide, a silicon oxide/silicon nitride/silicon oxide stacked layer or other appropriate charge-barrier materials. The barrier layer 206 is formed by thermal oxidation, for example. The control gate layer 208 is formed with polysilicon or other appropriate materials, and it is formed by chemical vapor deposition, for example.

A mask layer 210 is then formed over the control gate layer 208, wherein the mask layer 210 has an opening 212 that exposes a region predetermined for the memory cell. The mask layer 210 is formed with, for example, silicon oxide, silicon nitride, silicon oxynitride (SiOxNy), or other materials having an etching selectivity different from that of control gate layer 208. The mask layer 210 is formed by defining with a photoresist pattern having a critical dimension. In other words, the region predetermined for forming the memory cell can have the smallest dimension under the exposure limitation of the current photolithography process.

Thereafter, another mask layer 216 is formed on the sidewall of the opening 212. This mask layer 216 covers a portion of the exposed control gate layer 208. The mask layer 216 is formed with, for example, silicon oxide, silicon nitride, silicon oxynitride or other materials that have an etching selectivity different from that of the control gate layer 208. This mask layer 216 is formed by forming a conformal mask material layer (not shown in Figure) on the top surface of the mask layer 210 and a surface of the opening 212. An anisotrpic etching is then performed to remove the mask material layer at the top surface of the mask layer 210 and at the bottom surface of the opening 212.

Figure 2B:
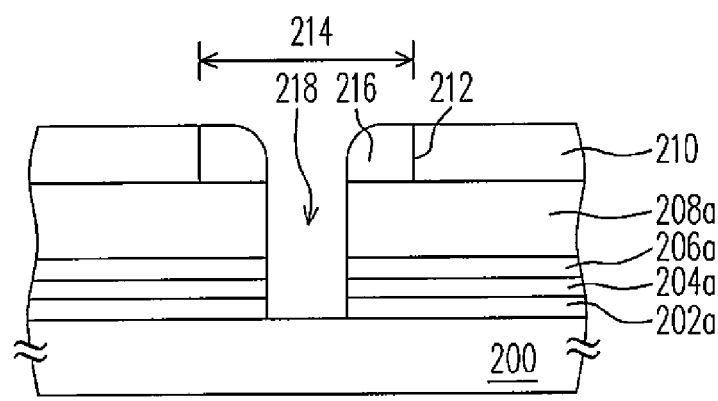

Referring to FIG. 2B, using the mask layer 210 and the mask layer 216 as a mask, portions of the control gate layer 208, the barrier layer 206, the charge trapping layer 204 and the tunneling layer 202 are removed to form an opening therein through these film layers and to form the control gate layer 208a, the barrier layer 206a, the charge trapping layer 204a and the tunneling layer 202a. Removing the portions of the control gate layer 208, the barrier layer 206, the charge trapping layer 204 and the tunneling layer 202 includes performing an anisotropic etching process.

Figure 2C:
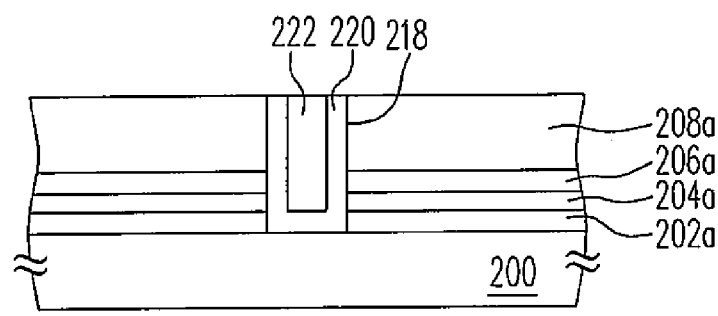

Thereafter, referring to FIG. 2C, after removing the mask layers 210, 216, an insulation layer 220 is formed on the surface of the opening 218, followed by forming a conductive layer 222 to fill the opening 218 and to cover the insulation layer 220. The material of the insulation layer 220 includes, but not limit to, silicon oxide, silicon nitride, silicon oxynitride or other appropriate dielectric materials. The conductive layer 222 is formed with polysilicon, metal or other appropriate conductive materials, for example.

In one embodiment, the insulation layer 220 and the conductive layer 222 are formed by, for example, forming a conformal insulation material layer (not shown) on the top surface of the control gate layer 208a and on the surface of the opening 218. The conformal insulation material layer is formed by chemical vapor deposition, for example. A conductive material layer is then formed on the insulation material layer, wherein the conductive material layer at least fills the opening 218. The conductive material layer is formed by a chemical vapor deposition process, for example. The conductive material layer and the insulation material layer disposed outside the opening 218 are removed. Removing the conductive material layer and the insulation material layer includes performing chemical mechanical polishing or etching back.

In another embodiment, the insulation layer 220 and the conductive layer 222 are formed by, for example, performing a chemical vapor deposition process to form a conformal insulation material layer (not shown in Figure) on the top surface of the control gate layer 208a and on the surface of the opening 218. The insulation material layer disposed outside the opening 218 is then removed to form the insulation layer 220. The insulation material is removed by performing a chemical mechanical polishing process or an etching-back process. A conductive material layer is further formed on the top surfaces of the insulation layer 220 and the control gate layer 208a, wherein the conductive material layer at least fills the opening 218. The conductive material layer is formed by chemical vapor deposition, for example. The conductive material layer disposed outside the opening 218 is ultimately removed, for example, by performing a chemical mechanical process or an etching-back process.

Figure 2D:
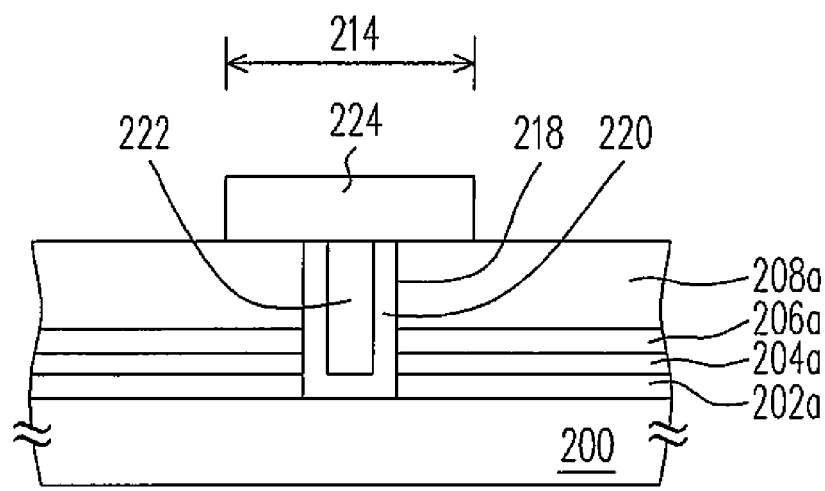

Continuing to FIG. 2D, a mask layer 224 is formed over a portion of the control gate layer 208a, the insulation layer 220 and the conductive layer 222. In one embodiment, the mask layer 224 covers a region 214 predetermined for the memory. The mask layer 224 is, but not limit to, a silicon oxide layer, a silicon nitride layer, a silicon oxynitride layer or a photoresist material layer. Further, when the mask layer 224 is a photoresist material layer, the dimension formed with the mask layer 224 is the smallest, under the limitation of the exposure resolution of the current photolithography process.

Figure 2E:
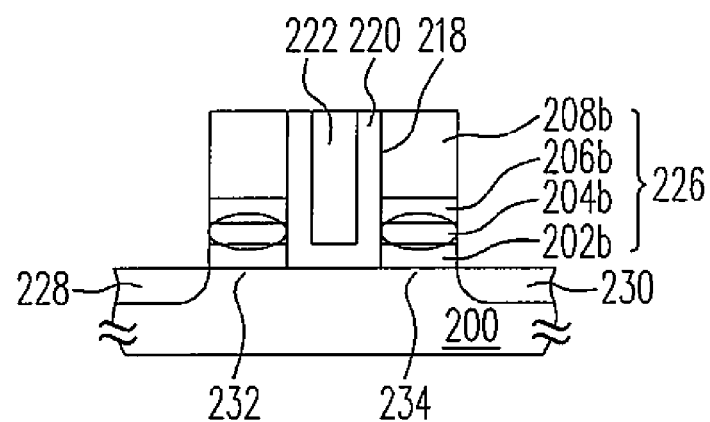

Referring to FIG. 2E, the mask layer 224 is used to define a gate stacked structure 226, wherein the gate stacked structure 226 is constituted with the tunneling layer 202b, the charge-trapping layer 204b, the barrier layer 206b and the control gate layer 208b. Thereafter, the mask layer 224 is removed. Source/drain regions 228, 230 are further formed in the substrate 200 beside the gate stacked structure 226.

The structure of the memory fabricated according to the above fabrication process is described in the following.

As shown in FIG. 2E, the non-volatile memory of the invention includes a substrate 200, a gate stacked layer 226, an insulation layer 220 and a conductive layer 222. The gate stacked layer 226 is disposed on the substrate 200, wherein the gate stacked layer 226 includes, sequentially from the substrate 200, a tunneling layer 202b, a charge-trapping layer 204b, a barrier layer 206b and a control gate layer 208b. The gate stacked layer 226 also has an opening 218 therein through the gate stacked layer 226. The tunneling layer 202b is formed with, for example, silicon oxide or other appropriate materials. The material of the charge-trapping layer 204b includes silicon oxide, silicon nitride or other appropriate materials. The barrier layer 206b is, but not limited to, a silicon oxide layer or a silicon oxide/silicon nitride/silicon oxide stacked layer. The control gate layer 208b includes a polysilicon layer or other conductive material layers, for example.

The insulation layer 220 is disposed on the surface of the opening 218, wherein the insulation layer 220 is formed with silicon oxide, silicon nitride, silicon oxynitride or other appropriate materials. Further, the conductive layer 222 is disposed in the opening 218, covering the insulation layer 220. The conductive layer 222 is, for example, a polysilicon layer, a metal layer or other appropriate conductive material layer.

In one embodiment of the invention, the non-volatile of the memory further includes a source region 228 and a drain region 230 disposed in the substrate 200 beside the gate stacked layer 226.

In accordance to the present invention, an insulation layer 220 is used to isolate the 2-bit regions, wherein the charges of each region can be stored in the charge-trapping layer 204b of a same memory. In programming the memory of the invention, regardless the injected charges are Gaussian distributed in the charge trapping layer 204b or not, the 2 bits of data in a single memory can be isolated with the insulation layer 220. Therefore, the problem of the two bits in a single memory interfering with each other is prevented. In addition of using an insulation layer to isolate the regions for storing two bits in a single SONOS memory, the method of fabricating a SONOS memory of the present invention is applicable to the fabrication of a flash memory. In other words, if the charge trapping layer 204 is a polysilicon type of conductive material layer in the above embodiment, the memory formed is a flash memory, and the charge trapping layer 204 is a floating gate. If the charge trapping layer 204 is a silicon nitride material layer, the memory formed according to this invention is a nitride read-only memory or a SONON memory.

In programming the memory, the control gate layer 208b and the conductive layer 222 are both coupled to a single node, which is a conventional approach in operating a memory. In another embodiment, the control gate layer 208b and the conductive layer 222 are coupled to different nodes. This method of operation is conducted as follows. In programming the memory, if charges are going to be stored at the right side (region 234) of the charge trapping layer 204b, voltages are applied to the control gate 208b at the right and the conductive layer 222, respectively. The charges at the source region 228 will travel from the control gate layer 208b at the left and the conductive layer 222 through the substrate 200 (channel region) to enter into the charge trapping layer 204b at the right side (region 234). In other words, the conductive layer 222 has a function similar to that of a gate, which can decide the opening and the closing of the channel region based upon the applied voltage.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating a non-volatile memory, the method comprising:
   forming sequentially a tunneling layer, a charge-trapping layer, a barrier layer and a control gate layer on a substrate;
   forming a first mask layer on the control gate layer, wherein the first mask layer comprises a first opening that exposes a region predetermined for forming the memory;
   forming a second mask layer on a sidewall of the first opening;
   removing portions of the control gate layer, the barrier layer, the charge-trapping layer and the tunneling layer to form a second opening through the control gate layer, the barrier layer, the charge-trapping layer and the tunneling layer, using the first and the second mask layers as a mask;
   removing the first and the second mask layers;
   forming an insulation layer on a surface of the second opening;
   forming a conductive layer to fill the second opening;
   forming a third mask on the control gate layer, the insulation layer and the conductive layer;
   defining a gate stacked structure using the third mask layer; and
   removing the third mask layer.

2. The method of claim 1, wherein the step of forming the second mask layer on the sidewall of the first opening comprises:
   forming a conformal first mask material layer on a surface of the first opening and on a top surface of the first mask layer; and
   performing an anistropic etching process to remove the first mask material layer at the top surface of the first mask layer and at a bottom of the opening.

3. The method of claim 1, wherein a dimension of the first opening of the first mask layer is a critical dimension of a photolithography process.

4. The method of claim 1, wherein a dimension of the third mask layer is a critical dimension of a photolithography process.

5. The method of claim 1, wherein the first mask layer comprises a material selected from the group consisting of silicon oxide, silicon nitride and silicon oxynitride.

6. The method of claim 1, wherein the second mask layer comprises a material selected from the group consisting of silicon oxide, silicon nitride and silicon oxynitride.

7. The method of claim 1, wherein the conductive layer comprises polysilicon.

8. The method of claim 1, wherein the charge trapping layer is a polysilicon layer or a silicon nitride layer.

9. The method of claim 1, wherein the tunneling layer comprises silicon oxide.

10. The method of claim 1, wherein the barrier layer comprises silicon oxide.

11. The method of claim 1, wherein the control gate layer comprises polysilicon.

12. The method of claim 1, wherein the step of forming the insulation layer on the surface of the second opening and the step of forming the conductive layer to fill the second opening comprise:
    forming a conformal first insulation material layer on a surface of the control gate layer and on the surface of the second opening;
    forming a conductive material layer on the insulation material layer, wherein the conductive material layer at least fills the second opening; and
    removing the conductive material layer and the insulation material layer outside the second opening.

13. The method of claim 1, wherein the step of forming the insulation layer on the surface of the second opening and the step of forming the conductive layer to fill the second opening comprise:
    forming a conformal insulation material layer on a top surface of the control gate layer and on the surface of the second opening;
    removing the insulation material layer outside the second opening to form the insulation layer;
    forming a conductive material layer on the insulation layer and on the top surface of the control gate; and
    removing the conductive layer outside the second opening.

14. The method of claim 1, wherein after the step of defining the stacked gate structure using the third mask layer further comprises forming a source region and a drain region in the substrate beside the stacked gate structure.

* * * * *